US005198713A

United States Patent [19]

Suzuta

[11] Patent Number: 5,198,713

[45] Date of Patent: Mar. 30, 1993

[54] ULTRASONIC TRANSDUCER APPARATUS

[75] Inventor: Toshihiko Suzuta, Hachioji, Japan

[73] Assignee: Olympus Optical Co., Ltd., Tokyo, Japan

[21] Appl. No.: 728,740

[22] Filed: Jul. 12, 1991

Related U.S. Application Data

[63] Continuation of Ser. No. 462,699, Jan. 9, 1990.

[30] Foreign Application Priority Data

| | | | |
|---|---|---|---|
| Apr. 19, 1989 | [JP] | Japan | 1-99447 |
| Apr. 25, 1989 | [JP] | Japan | 1-105285 |
| Apr. 25, 1989 | [JP] | Japan | 1-105286 |

[51] Int. Cl.[5] .......... H01L 41/08

[52] U.S. Cl. .......... 310/316; 310/317

[58] Field of Search .......... 310/316, 317

[56] References Cited

U.S. PATENT DOCUMENTS

| | | | |
|---|---|---|---|
| 2,683,866 | 7/1954 | Samsel | 310/317 |
| 3,363,117 | 1/1968 | Mondot et al. | 310/317 |
| 3,409,787 | 11/1968 | Agalides et al. | 310/316 |
| 3,666,599 | 5/1972 | Obeda | 310/316 |
| 3,746,897 | 7/1973 | Karatjas | 310/316 |
| 3,975,650 | 8/1976 | Payne | 310/316 |
| 4,168,447 | 9/1979 | Bussiere et al. | 310/316 |
| 4,582,067 | 4/1986 | Silverstein | 128/663 |
| 4,692,672 | 9/1987 | Okuno | 310/317 |
| 4,770,185 | 9/1988 | Silverstein | 128/661.08 |
| 4,957,100 | 9/1990 | Herzog et al. | 310/317 |
| 4,965,532 | 10/1990 | Sakurai | 310/316 |
| 4,970,656 | 11/1990 | Lo et al. | 364/481 |
| 4,979,952 | 12/1990 | Kubota et al. | 310/316 |
| 4,996,502 | 2/1991 | Endo | 310/317 |
| 5,026,387 | 6/1991 | Thomas | 310/316 |

FOREIGN PATENT DOCUMENTS

| | | | |
|---|---|---|---|
| 54-136943 | 9/1979 | Japan . | |
| 57-122854 | 7/1982 | Japan . | |
| 60-54059 | 11/1985 | Japan . | |
| 61-58286 | 3/1986 | Japan | 310/317 |
| 63-71014 | 5/1988 | Japan . | |

*Primary Examiner*—Mark O. Budd
*Assistant Examiner*—Thomas M. Dougherty
*Attorney, Agent, or Firm*—Frishauf, Holtz, Goodman & Woodward

[57] ABSTRACT

In an ultrasonic transducer apparatus, one of ultrasonic transducer probes of a plurality of types is selectively connected to a driving unit. The ultrasonic probe includes an ultrasonic transducer having a series connection of an inductor, a resistor, and a capacitor, and a dumping capacitor connected in parallel with the series connection. The driving unit includes a driving circuit for supplying to the ultrasonic transducer a driving signal having a frequency where a phase difference between a voltage applied to the ultrasonic transducer and a current supplied to the ultrasonic transducer is substantially set to be zero, and an inductor connected to an output terminal of the driving circuit to be connected in parallel with the ultrasonic transducer. The inductor includes a plurality of intermediate taps having a different inductances, and each tap is connected to a connection terminal of the probe. The probe includes wiring for selecting the connection terminal so that an inductance corresponding to capacitive susceptance of the dumping capacitor of the ultrasonic transducer is connected in parallel with the ultrasonic transducer in a connector for connecting the probe and the driving unit.

14 Claims, 10 Drawing Sheets

ULTRASONIC TRANSDUCER APPARATUS

This is a continuation of application Ser. No. 07/462,699 filed Jan. 9, 1990.

BACKGROUND OF THE INVENTION

1. Field of the Invention

The present invention relates to an ultrasonic transducer apparatus for breaking a calculus or eliminating a tumor utilizing ultrasonic oscillations.

2. Description of the Related Art

As shown in FIG. 1, a conventional ultrasonic transducer apparatus of this type includes a driving unit 1 having a driving circuit 2, and an ultrasonic transducer probe 3 which has an ultrasonic transducer 4 and which is detachable from the driving unit 1.

As shown in FIG. 2, an equivalent circuit of the ultrasonic transducer 4 includes an LCR series resonance circuit formed of an inductor 5, a capacitor 6, and a resistor 7, and a dumping capacitor Cd connected in parallel with the LCR series resonance circuit. When a voltage is applied to the ultrasonic transducer 4, currents il and id are supplied through the LCR series resonance circuit and the dumping capacitor Cd, respectively. Of the currents il and id, only the current il is converted into ultrasonic oscillations. Therefore, it is most efficient to drive the ultrasonic transducer 4 at a resonance frequency of the LCR series resonance circuit. The resonance frequency of the series resonance circuit is referred to as a mechanical resonance frequency ft for the ultrasonic transducer 4 hereinafter.

Since a conductance G of the ultrasonic transducer 4 is maximum at the mechanical resonance frequency ft, the frequency ft is a rightmost point in a graph of an admittance Y ($=G+jB$) of the ultrasonic transducer 4, as shown in FIG. 3. FIG. 3 shows a locus of the admittance Y obtained when an angular frequency $\omega$ is a variable. Reference symbol B denotes a susceptance; and $\omega$, a driving angular frequency ($=2\pi f$).

The conventional driving circuit 2 includes a phase-locked loop (PLL) circuit to lock the driving frequency when the conductance is maximum. The PLL circuit controls the driving frequency to make a phase difference between a voltage applied to the ultrasonic transducer 4 and a current supplied to the ultrasonic transducer 4, i.e., a susceptance, zero. As shown in FIG. 3, however, the center of an admittance characteristic circle of the ultrasonic transducer 4 is shifted in the positive direction of the susceptance by a capacitive susceptance $\omega$Cd of the dumping capacitor Cd. Therefore, a lock point (point at which a susceptance is zero) PR obtained by the PLL does not coincide with the mechanical resonance point ft (point at which a conductance is maximum), i.e., the transducer 4 cannot be driven at the mechanical resonance frequency even if a phase difference between the voltage and the current is set to be zero. As a result, conversion efficiency of a driving signal into ultrasonic oscillations is poor.

An apparatus to eliminate the above drawback is disclosed in Published Unexamined Japanese Utility Model Application No. 54-136943. As shown in FIG. 4, in this apparatus, the driving unit 1 includes an inductor Ld arranged in parallel with the ultrasonic transducer 4 besides the driving circuit 2. According to this apparatus, as shown in FIG. 5, a capacitive susceptance $\omega$Cd of the dumping capacitor Cd included in the ultrasonic transducer 4 can be canceled by an inductive susceptance ($=1/\omega$Ld) of the inductor Ld. As a result, as shown in FIG. 5, the center of the admittance characteristic circle of the equivalent circuit of the ultrasonic transducer 4 is positioned on the axis where the susceptance is zero, and the lock point PR obtained by the PLL coincides with the mechanical resonance point ft. Therefore, the ultrasonic transducer 4 can be efficiently driven.

A capacitive susceptance of the dumping capacitor in the ultrasonic transducer probe is varied depending on its shape or the characteristics of the ultrasonic transducer included in the probe. For this reason, in the ultrasonic transducer apparatus in which different types of ultrasonic transducer probes can be connected to the above-mentioned driving unit shown in FIG. 4, capacitive susceptances of dumping capacitors in the ultrasonic transducers of all probes cannot be canceled. In other words, in a driving unit including only one inductor Ld, capacitive susceptances of different dumping capacitors cannot be perfectly canceled. Therefore, when various ultrasonic transducer probes are selectively connected to a driving unit as in an ultrasonic medical treatment apparatus in accordance with a target to be treated, various ultrasonic transducers cannot be driven at respective optimal mechanical resonance points. As a result, driving efficiency is poor.

SUMMARY OF THE INVENTION

It is an object of the present invention to provide an ultrasonic transducer apparatus which reliably drives an ultrasonic transducer at its mechanical resonance frequency even when types of ultrasonic transducer in an ultrasonic transducer probe connected to a driving unit are different so that capacitive susceptances of dumping capacitors are different, thereby efficiently converting a driving signal into ultrasonic oscillations.

According to the present invention, there is provided an ultrasonic transducer apparatus comprising a probe including an ultrasonic transducer formed of a series connection of an inductor, a resistor, and a capacitor, and a dumping capacitor connected in parallel with the series connection; a driving unit detachably connected to the probe and including a driving circuit for supplying to the ultrasonic transducer a driving signal having a frequency where a phase difference between a voltage applied to the ultrasonic transducer and a current supplied to the ultrasonic transducer is substantially zero, and an inductor connected in parallel with the ultrasonic transducer; and an impedance matching element arranged in at least one of the probe and the driving unit and having an impedance corresponding to a capacitive susceptance of the dumping capacitance.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

DETAILED DESCRIPTION OF THE PREFERRED EMBODIMENTS

An ultrasonic transducer apparatus according to preferred embodiments of the present invention will be described hereinafter with reference to the accompanying drawings.

Figure 6:
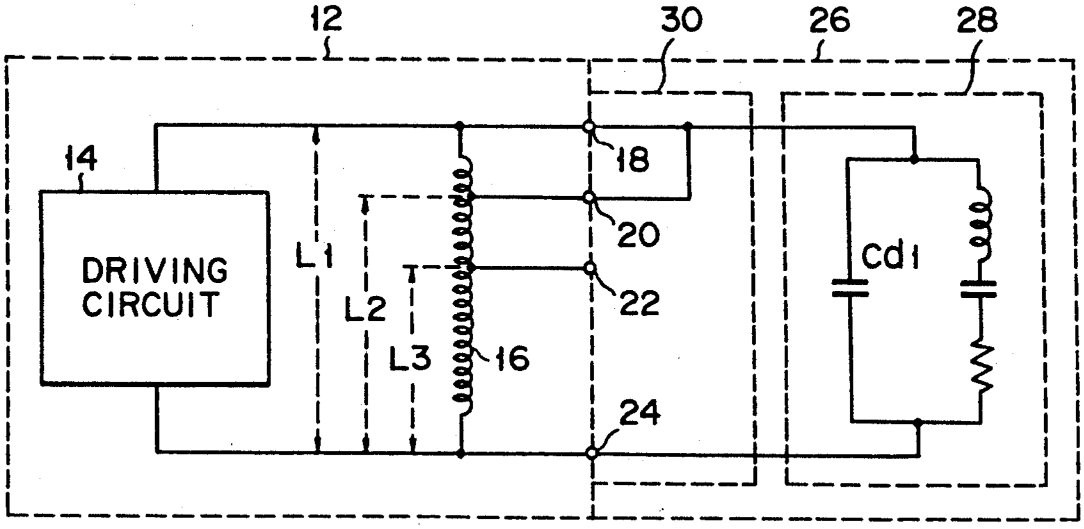
FIG. 6 is a block diagram of an ultrasonic transducer apparatus according to a first embodiment of the present invention.

FIG. 6 is a block diagram showing an arrangement of the first embodiment. A driving unit 12 includes a driving circuit 14, an inductor 16, and connection terminals 18, 20, 22, and 24. Output terminals of the driving circuit 14 are respectively connected to the connection terminals 18 and 24. The inductor 16 is connected between the connection terminals 18 and 24. An inductance of the inductor 16 is constant, i.e., L1. The inductor 16 includes intermediate taps at positions corresponding to inductances L2 and L3 (L1>L2>L3), respectively. The intermediate taps corresponding to the inductances L2 and L3 are connected to the connection terminals 20 and 22, respectively. More specifically, the inductances between the terminals 18 and 24 can be switched to the inductance L1, L2, or L3.

Figure 1:
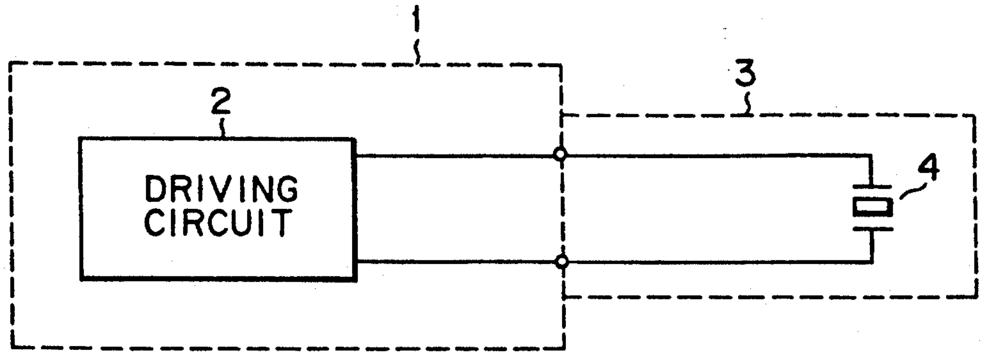
FIG. 1 (PRIOR ART)
FIG. 1 is a block diagram of a conventional ultrasonic transducer apparatus.
Figure 2:
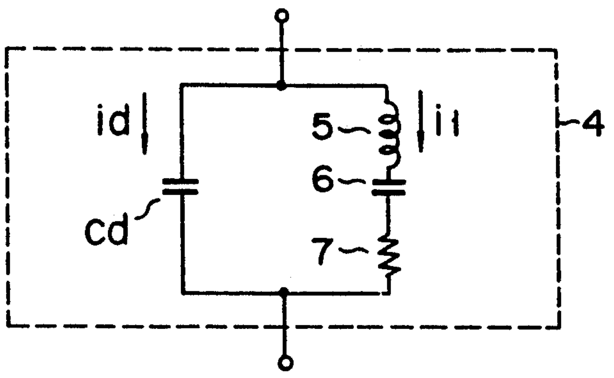
FIG. 2 (PRIOR ART)
FIG. 2 is an equivalent circuit diagram of an ultrasonic transducer.
Figure 3:
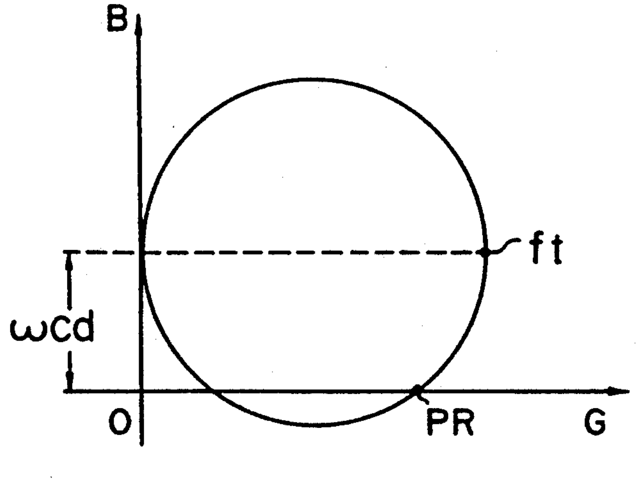
FIG. 3 (PRIOR ART)
FIG. 3 is a graph of an admittance characteristic for explaining an operation of the conventional apparatus shown in FIG. 1.
Figure 4:
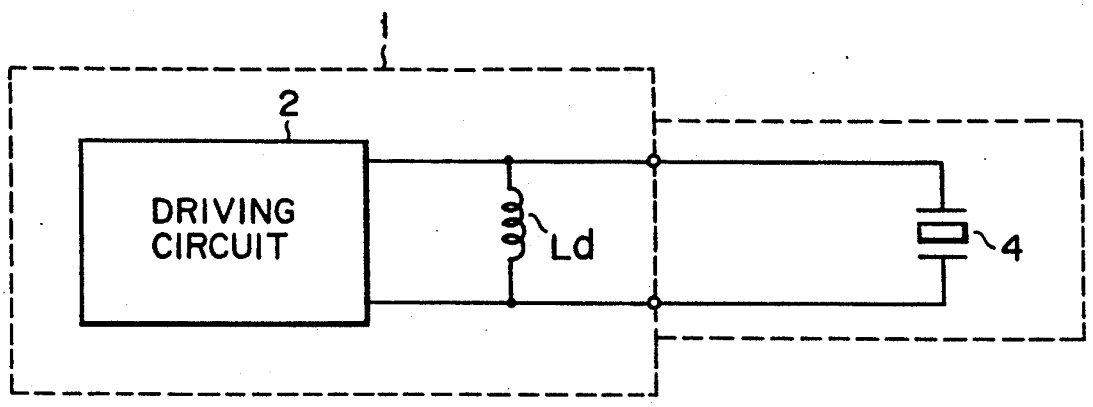
F I G. 4 (PRIOR ART)
FIG. 4 is a block diagram of another conventional ultrasonic transducer apparatus.

An ultrasonic transducer probe 26 includes an ultrasonic transducer 28 having an equivalent circuit shown in FIG. 2, and a connector 30 connected to the driving unit 12 through the connection terminals 18, 20, 22, and 24.

When this embodiment is applied to an ultrasonic medical treatment apparatus, the probe includes a horn or a pipe (not shown) for efficiently transmitting ultrasonic oscillations of the ultrasonic transducer 28 to a morbid part. Such a probe is known as a Langevin-type transducer probe.

Figure 7:
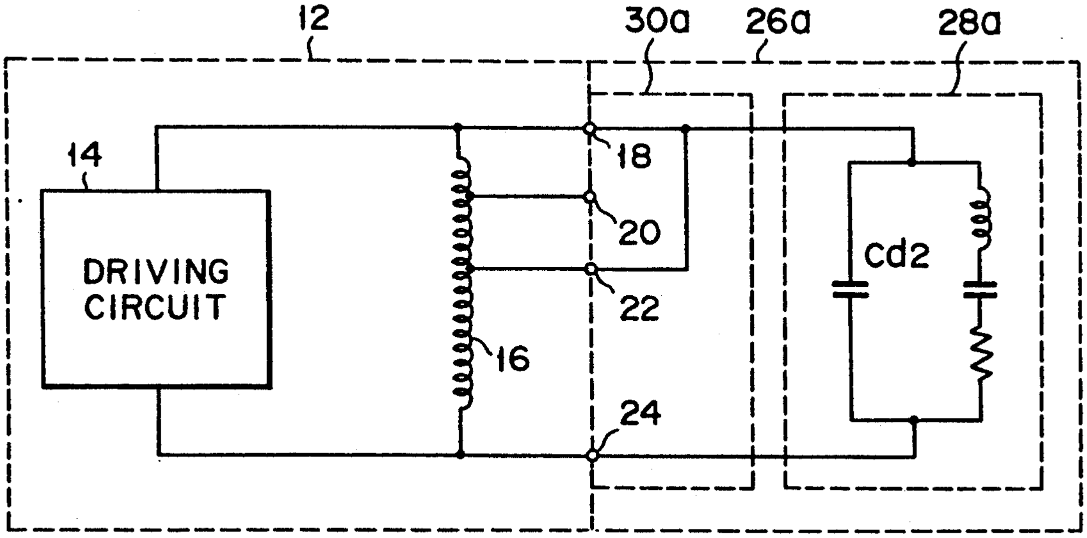
FIG. 7 is a block diagram showing the first embodiment with another ultrasonic transducer probe.

The ultrasonic transducer 28 is connected between the connection terminals 18 and 24. It is assumed that a capacitance of a dumping capacitor in the ultrasonic transducer 28 is Cd1. The probe 26 is detachably connected to the driving unit 12 through the connector 30. More specifically, another ultrasonic transducer probe **26*a* of another type having an ultrasonic transducer 28*a* as shown in FIG. 7 can be connected to the driving unit 12. It is assumed that the dumping capacitance of the ultrasonic transducer 28*a*** is Cd2.

The connector of each probe includes a wiring for connecting the connection terminal 18 to the connection terminal 20 or 22 or does not include the wiring so as not to connect the connection terminal 18 to other connection terminals at all in accordance with the capacitance of the dumping capacitor of the ultrasonic transducer. More specifically, when the probe is connected to the driving unit, an inductor for providing an inductive susceptance having an absolute value equal to that of a capacitive susceptance of the dumping capacitor in the ultrasonic transducer is connected in parallel with the ultrasonic transducer, and the capacitive susceptance (positive) of the ultrasonic transducer is canceled by the inductive susceptance (negative) of the inductor 16.

Figure 8:
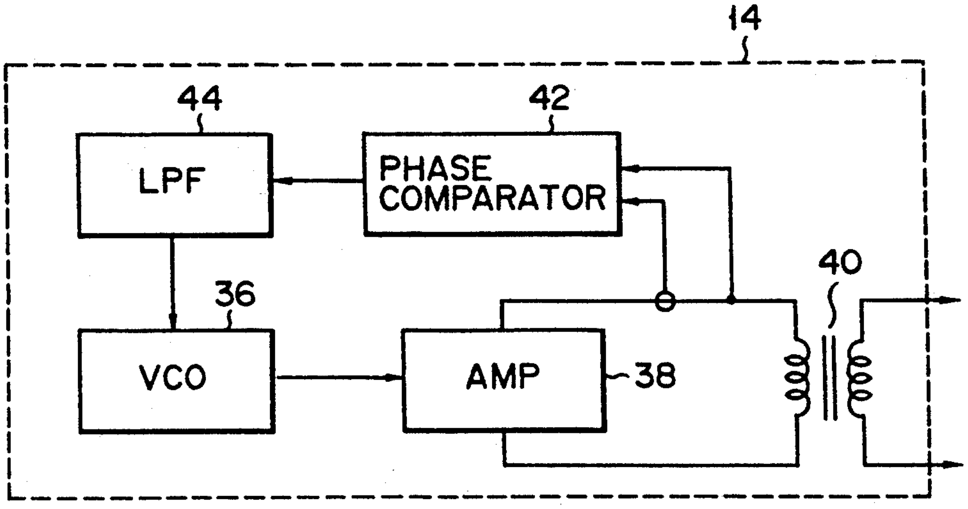
FIG. 8 is a block diagram of a driving circuit for the first embodiment.

A detailed arrangement of the driving circuit 14 is shown in FIG. 8. An output from a voltage-controlled oscillator 36 is supplied to the connection terminals 18 and 24 through an amplifier 38 and a transformer 40. Phases of an output voltage and an output current from the amplifier 38 are detected, and detection results are input to a phase comparator 42. A phase difference between the output voltage and the output current is applied to the control terminal of the oscillator 36 through a low-pass filter 44. Thus, the driving circuit 14 includes a PLL circuit for locking a driving frequency at the mechanical resonance frequency where the susceptance of the ultrasonic transducer 28 of the ultrasonic probe is substantially zero, i.e., a conductance is maximum.

Figure 5:
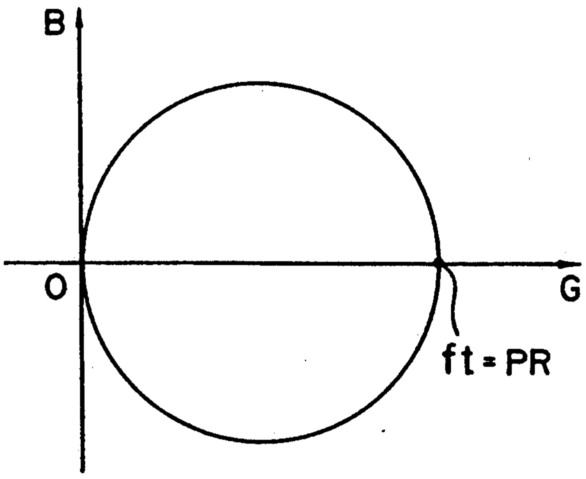
F I G. 5 (PRIOR ART)
FIG. 5 is a graph of an admittance characteristic for explaining an operation of the conventional apparatus shown in FIG. 4.

As described above, according to the first embodiment, a plurality of intermediate taps are arranged at the inductor 52 in the driving unit 12 to provide a plurality of inductances, and the wiring in the connector 30 of the probe 26 is varied in accordance with a capacitive susceptance of the dumping capacitor in the ultrasonic transducer 28. Therefore, an inductance corresponding to the capacitive susceptance of the dumping capacitor can be selectively connected in parallel to the ultrasonic transducer 28. Even if a different kind of probe is connected to the driving unit 12, a capacitive susceptance of the dumping capacitor can be perfectly canceled by the inductive inductance of the inductor 16. Therefore, the ultrasonic transducer has admittance characteristics shown in FIG. 5, and a lock point obtained by the driving circuit 14 having the PLL circuit coincides with the mechanical resonance point of the ultrasonic transducer. As a result, when another ultrasonic oscillator probe is connected to this driving unit 12, the driving circuit 14 can reliably drive the ultrasonic transducer 28 at its mechanical resonance point. This apparatus allows an improvement of efficiency achieved when a calculus is broken, or a tumor is eliminated. Note that the number of taps is not limited to three. When the number of types of probe is increased, the number of taps may be increased in accordance with the number of types of probe.

Figure 9:
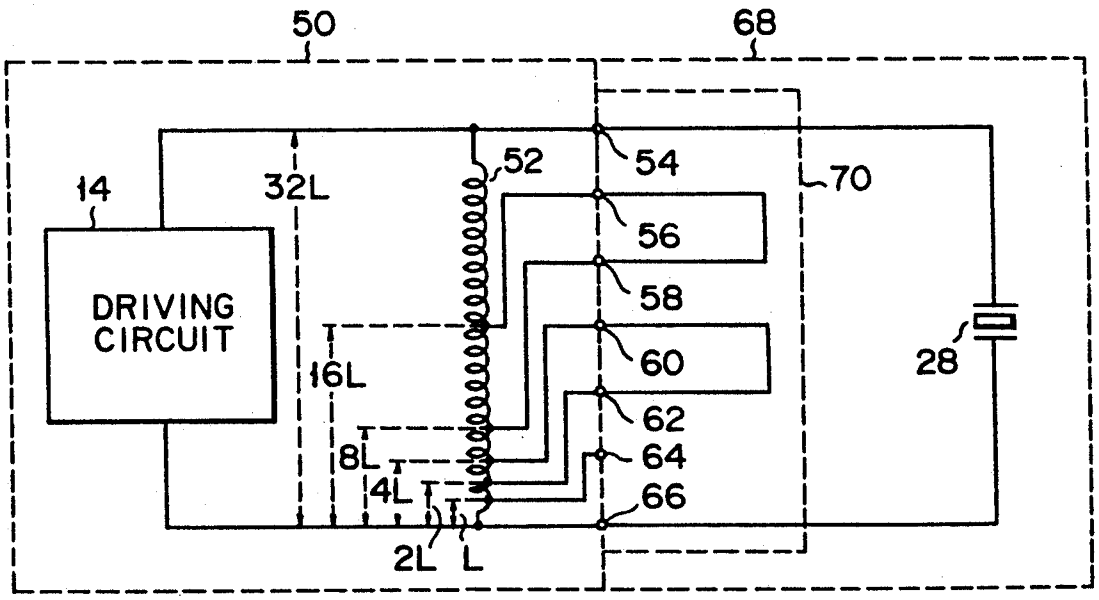
FIG. 9 is a block diagram of an ultrasonic transducer apparatus according to a second embodiment of the present invention.

FIG. 9 is a block diagram showing the second embodiment. In the second embodiment, intermediate taps are arranged at an inductor in the same manner as in the first embodiment, and an inductance is selected upon selection of the tap. In the second embodiment, each tap is positioned so that an inductance is multiplied, and the larger number of inductance levels than the number of taps can be obtained in accordance with a combination of the inductances between the taps.

A driving unit 50 includes the driving circuit 14, an inductor 52, and connection terminals 54, 56, 58, 60, 62, 64, and 66. Output terminals of the driving circuit 14 are respectively connected to the connection between the connection terminals 54 and 66. A total inductance of the inductor 52 is 32L, and the intermediate taps are arranged at positions where the inductances from the connection terminal 66 are L, 2L, 4L, 8L, and 16L, respectively. The taps corresponding to the inductances 16L, 8L, 4L, 2L, and L are connected to the connection terminals 56, 58, 60, 62, and 64, respectively.

Figure 10:
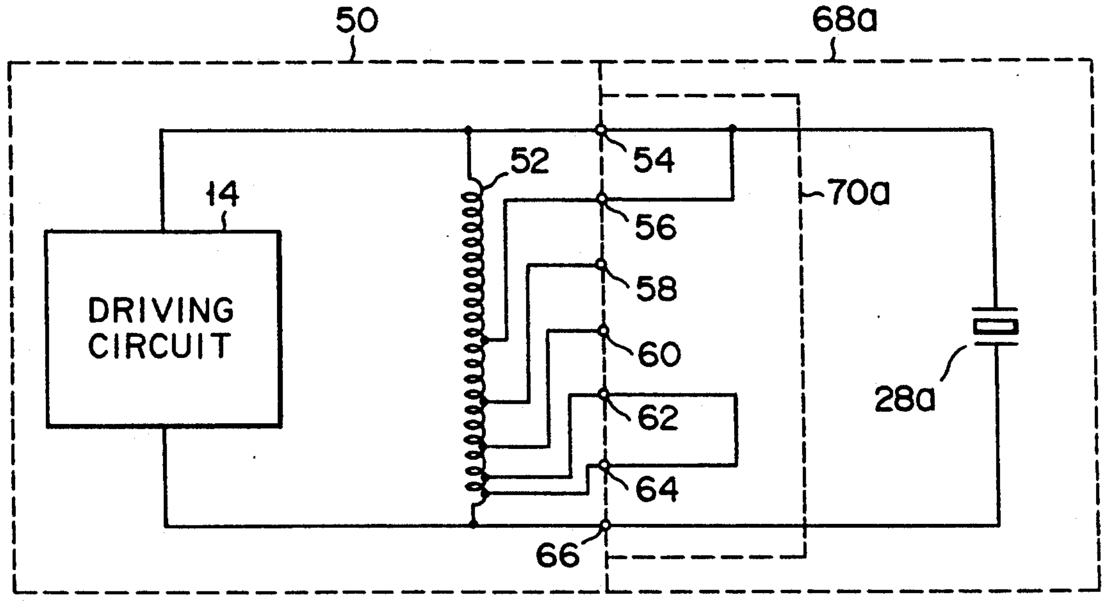
FIG. 10 is a block diagram of the second embodiment with another ultrasonic transducer probe.

An ultrasonic transducer probe 68 includes the ultrasonic transducer 28, and a connector 70 detachably connected to the driving unit 50 through the connection terminals 54, 56, 58, 60, 62, 64, and 66. The ultrasonic transducer 28 is connected between the connection terminals 54 and 66. The connector 70 includes or does not include wirings for connecting arbitrary pairs of the connection terminals 54, 56, 58, 60, 62, 64, and 66 to each other in accordance with a capacitive susceptance of the dumping capacitor in the ultrasonic transducer 28. For this reason, the inductance of the inductor 52 can be varied in 32 ways of L to 32L depending on interconnections of the connection terminals. Thus, the connector 70 includes the wiring for determining an inductance of the inductor 52 so that the inductive susceptance of the inductor 52 connected in parallel with the ultrasonic transducer 28, when the probe 68 is connected to the driving unit 50, is equal to a capacitive susceptance of the ultrasonic transducer. In the arrangement shown in FIG. 9, the connection terminals 56 and 58, and the connection terminals 60 and 62 are connected to each other; the inductance of the inductor 52 is set to be 22L. In another probe 68*a* shown in FIG. 10, the connection terminals 54 and 56, and the connection terminals 62 and 64 are connected to each other; the inductance of the inductor 52 is set to be 14L.

According to the second embodiment, the capacitive susceptance of the dumping capacitor can be canceled by the inductive inductance of the inductor in the same manner as in the first embodiment. In addition, the inductance of the inductor can be varied in a large number of levels. Therefore, this apparatus can be applied to various ultrasonic probes as compared with that in the first embodiment. Even if a new type of ultrasonic oscillator probe is manufactured, the capacitive susceptance of a dumping capacitor can be reliably canceled by changing wiring in the connector without increasing the number of intermediate taps of the inductor and changing the structure of the driving unit.

Figure 11:
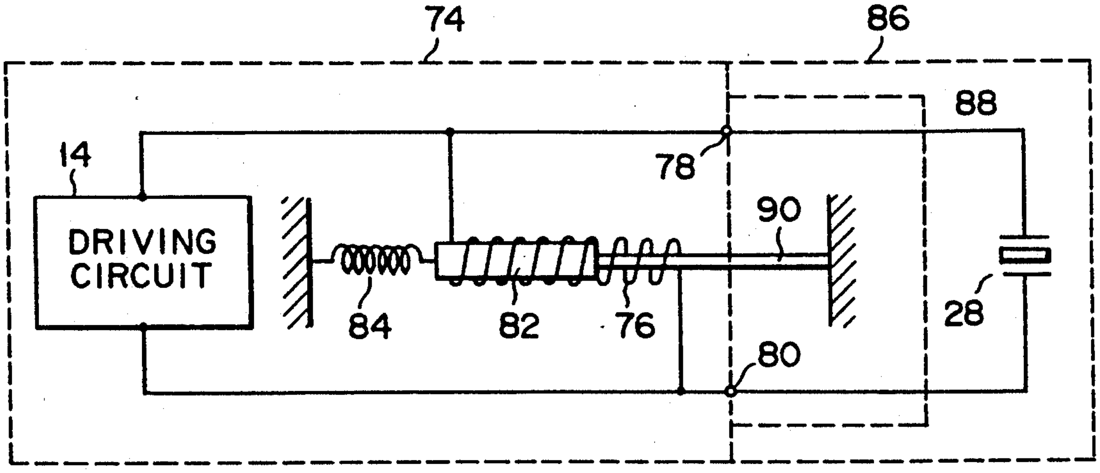
FIG. 11 is a block diagram of an ultrasonic transducer apparatus according to a third embodiment of the present invention.

FIG. 11 is a block diagram showing the third embodiment. In the third embodiment, an inductance of an inductor is varied in accordance with the type of probe connected to a driving unit, i.e., a capacitive susceptance of a dumping capacitor, in the same manner as in the first and second embodiments. Although the inductance is varied in a stepped manner upon selection of the tap in the first and second embodiments, a core of a coil of the inductor is slid to continuously change the inductance in the third embodiment.

A driving unit 74 includes the driving circuit 14, an inductor 76, and connection terminals 78 and 80. Output terminals of the driving circuit 14 are respectively connected to the connection terminals 78 and 80, and the inductor 76 is connected between the connection terminals 78 and 80. A ferrite core 82 is inserted in a coil of the inductor 76. One end of the ferrite core 82 is fixed to a part of a housing of the driving unit 74 through a spring 84. The spring 84 is biased in its extending direction, and the core 82 is biased in the right direction in FIG. 11.

Figure 12:
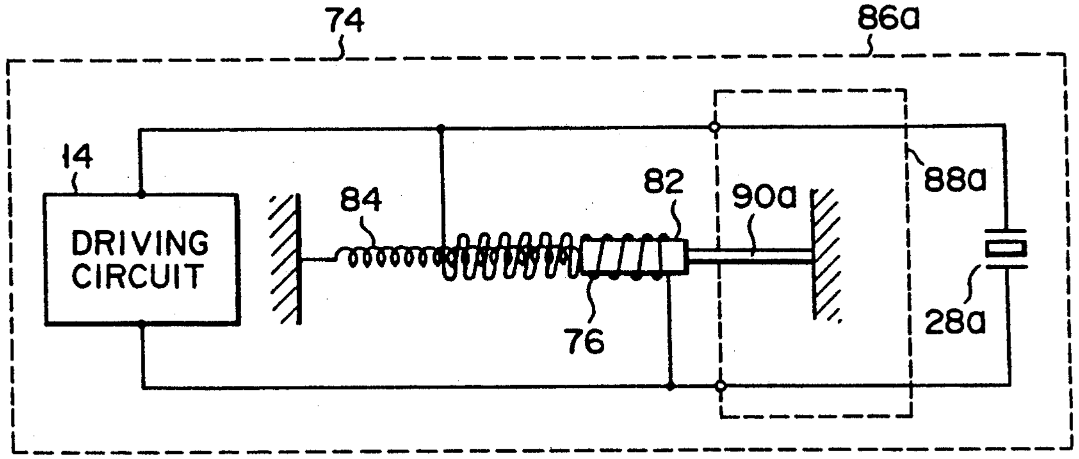
FIG. 12 is a block diagram of the third embodiment with another ultrasonic transducer probe.

An ultrasonic oscillator probe 86 includes the ultrasonic transducer 28, and a connector 88 detachably connected to the driving unit 74 through the connection terminals 78 and 80. The ultrasonic transducer 28 is connected between the connection terminals 78 and 80. The connector 88 holds a bar 90 for pushing the other end of the ferrite core 82 against a biasing force of the spring 84 when the probe 86 is connected to the driving unit 74. One end of the bar 90 is fixed in the connector 88. The length of the bar 90 is determined in accordance with the capacitive susceptance of the dumping capacitor in the ultrasonic transducer 28. In the arrangement shown in FIG. 11, the length of the bar 90 is relatively long, and the bar 90 deeply pushes the ferrite core 82 in. In contrast to this, in a probe 86*a* shown in FIG. 12, the length of the bar 90*a* is relatively short, and the bar 90*a* hardly pushes the ferrite core 82 in. Therefore, the position of the ferrite core 82 in the coil is varied in accordance with the type of the probe 86, and the inductance of the inductor 76 is varied in accordance with a change in position of the core 82. More specifically, the lengths of the bars 90 and 90*a* are determined in accordance with the capacitive susceptance of the dumping capacitor in the ultrasonic transducer 28, i.e., to move the ferrite core 82 so that an inductive susceptance of the inductor 76 equal to the capacitive susceptance can be provided. For this reason, the inductance of the inductor 76 can be continuously varied.

According to the third embodiment, the capacitive susceptance of the dumping capacitor can be canceled by the inductive susceptance of the inductor in the same manner as in the first and second embodiments. In addition, the infinite number of variations in inductance can be achieved. Therefore, this apparatus can be applied to various ultrasonic transducer probes as compared with those in the first and second embodiments. Even if a new type of ultrasonic transducer probe is manufactured, the capacitive susceptance of the dumping capacitor can be reliably canceled by only changing the length of a bar in the connector without changing the structure of the driving unit.

Figure 13:
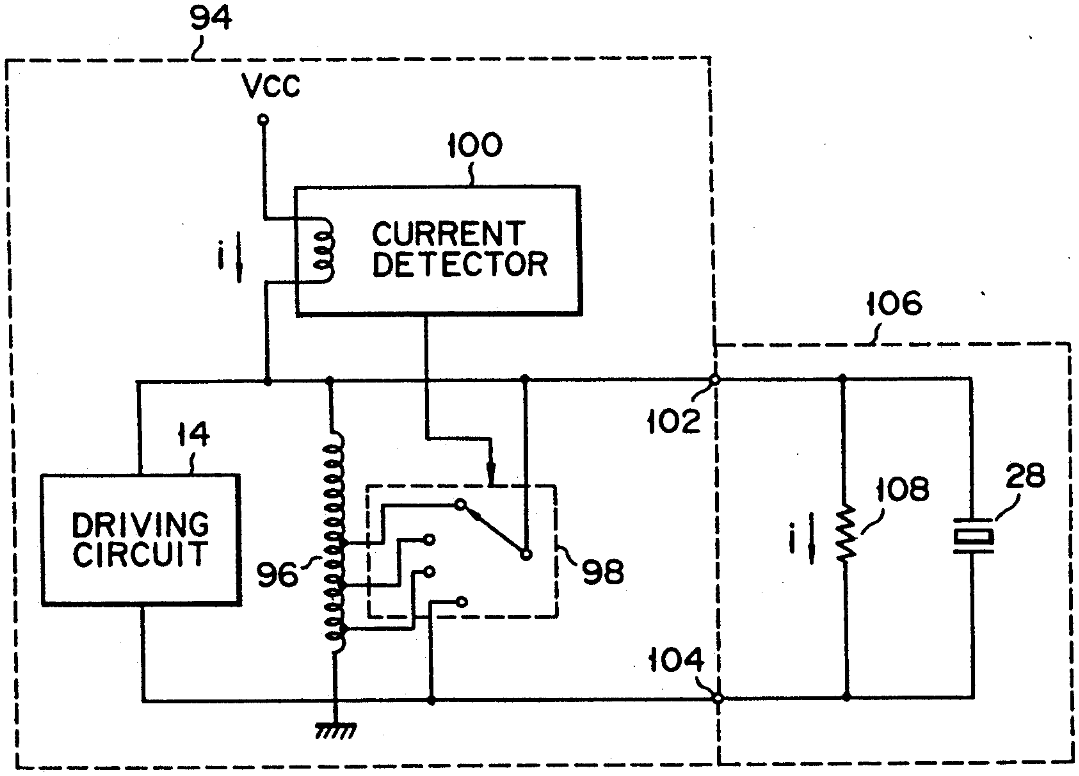
FIG. 13 is a block diagram of an ultrasonic transducer apparatus according to a fourth embodiment of the present invention.

FIG. 13 is a block diagram showing the fourth embodiment. In the fourth embodiment, an inductance can be varied by selecting an appropriate tap of the inductor in a driving unit in the same manner as in the first and second embodiments. This selection is not performed by the wiring or the bar arranged in the probe, but by a current detector arranged in a driving unit.

A driving unit 94 includes the driving circuit 14, an inductor 96 with intermediate taps, a selector 98 for selecting the tap, a current detector 100, and connection terminals 102 and 104. Output terminals of the driving circuit 14 are respectively connected to the connection terminals 102 and 104, and the inductor 96 is connected between the connection terminals 102 and 104. Each tap of the inductor 96 is connected to the connection terminal 102 through the selector 98. Therefore, when the selector 98 is switched, the inductance between the connection terminals 102 and 104 can be varied. The current detector 100 is connected between a power source Vcc and the connection terminal 102.

An ultrasonic oscillator probe 106 is detachably connected to the driving unit 94 through the connection terminals 102 and 104, and includes the ultrasonic transducer 28 connected between the connection terminals 102 and 104, and a resistor 108 connected in parallel with the ultrasonic transducer 28. The resistance of the resistor 108 corresponds to the capacitive susceptance of the dumping capacitor in the ultrasonic transducer 28.

When the ultrasonic probe 106 is connected to the driving unit 94, the current detector 100 detects a current supplied through the resistor 108, i.e., the resistance of the resistor 108, and switches the selector 98 in accordance with the detected value. One of the taps of the inductor 96 is connected to the connection terminal 102 to change the inductance of the inductor 96. Since the resistance of the resistor 108 corresponds to the capacitive susceptance of the ultrasonic transducer 28, the inductance of the inductor 96 can be varied in accordance with the capacitance of the dumping capacitor in the ultrasonic transducer 28. As a result, the capacitive susceptance of the dumping capacitor of the ultrasonic transducer 28 is canceled by the inductive susceptance of the inductor.

According to the fourth embodiment, the capacitive susceptance of the dumping capacitor can be canceled by the inductive susceptance of the inductor in the same manner as in the first to third embodiments, and the structure of the probe 106 is changed in accordance with the types of probe by merely changing the resistor 108. Therefore, even if any probe 106 is connected to this driving unit 94, driving at a resonance point can be performed.

As described above, according to the first to fourth embodiments, there is provided an ultrasonic transducer apparatus which can reliably cancel a capacitive susceptance of the ultrasonic transducer by changing an inductance of the inductor arranged in the driving unit in accordance with the capacitive susceptance. Therefore, even if the capacitive susceptance of the ultrasonic transducer is changed depending on a type of ultrasonic oscillator probe, the ultrasonic transducer can be driven at its mechanical resonance point, thereby efficiently generating ultrasonic oscillations.

In the first to fourth embodiments, a change in capacitive susceptance of the ultrasonic transducer for each probe is compensated for by varying the inductance of the inductor arranged in the driving unit in accordance with the types of ultrasonic probe. Other embodiments wherein a parallel circuit including an inductor and a capacitor is arranged in the driving unit and the capacitance is changed in accordance with types of ultrasonic probe, so that an inductive susceptance of the driving unit is equivalently varied to compensate for a change in capacitive susceptance for each probe will be described hereinafter.

Figure 14:
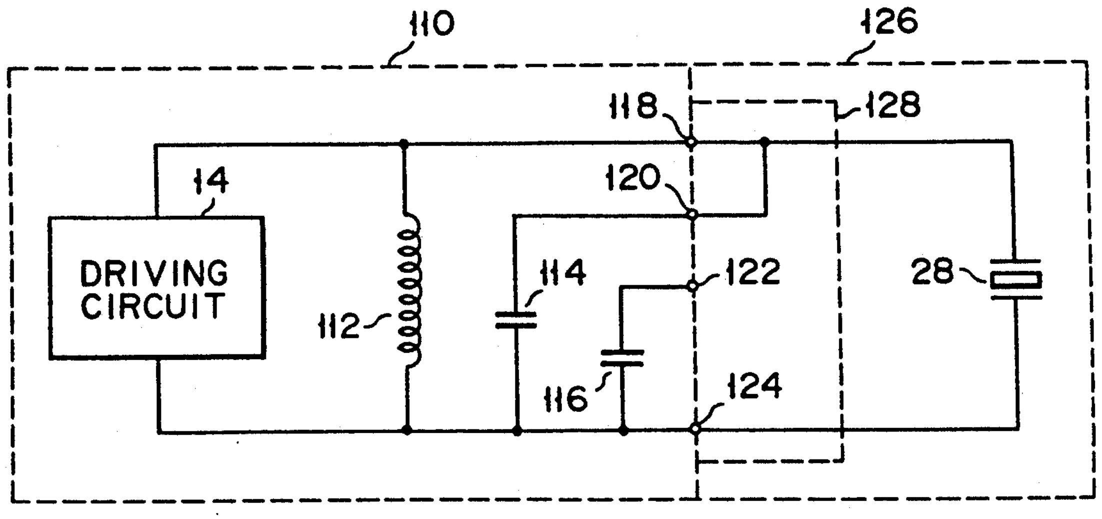
FIG. 14 is a block diagram of an ultrasonic transducer apparatus according to a fifth embodiment of the present invention.

FIG. 14 is a block diagram showing the fifth embodiment. A driving unit 110 includes the driving circuit 14, an inductor 112, connection terminals 118, 120, 122, and 124, and capacitors 114 and 116. Output terminals of the driving circuit 14 are respectively connected to the connection terminals 118 and 124, and the inductor 112 is connected between the connection terminals 118 and 124. The capacitor 114 is connected between the connection terminals 120 and 124, and the capacitor 116 is connected between the connection terminals 122 and 124. It is assumed that the capacitances of the capacitors 114 and 116 are C1 and C2, respectively.

Figure 15:
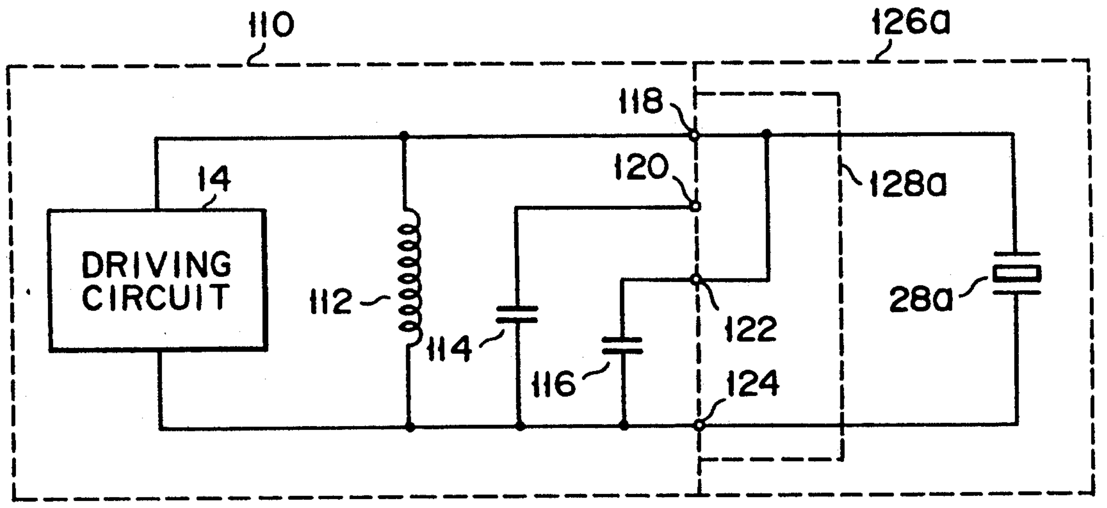
FIG. 15 is a block diagram of the fifth embodiment with another ultrasonic transducer probe.

An ultrasonic transducer probe 126 includes the ultrasonic transducer 28 and a connector 128 connected to the driving unit 110 through the connection terminals 118, 120, 122, and 124. The ultrasonic transducer 28 is connected between the connection terminals 118 and 124. A dumping capacitance of the ultrasonic transducer 28 is assumed to be Cd1. The probe 126 is detachably connected to the driving unit 110 through the connector 128. More specifically, an ultrasonic transducer probe **126*a* having an ultrasonic transducer 28*a* of another type shown in FIG. 15 can be connected to the driving unit 110. It is assumed that the dumping capacitance of the ultrasonic transducer 28*a*** is Cd2.

The connector of each probe includes a wiring for connecting the connection terminal 118 to the connection terminal 120 or 122 or does not include the wiring so as not to connect the terminal 118 to any connection terminals in accordance with the capacitance of the dumping capacitor of the ultrasonic transducer. More specifically, the connector 128 has the wiring for connecting the capacitor 114 or 116 in parallel with the inductor 112. When the probe 126 is connected to the driving unit 110, a susceptance (inductive property) obtained by the parallel circuit of the inductor 112 and the capacitor 114 or 116 cancels a capacitive susceptance of the dumping capacitor of the ultrasonic transducer.

This can be mathematically proved as follows. The capacitances of the capacitors 114 and 116 are determined to establish the following relationship with respect to the capacitance of the ultrasonic transducer which can be connected to the driving unit 110:

$$\omega^2 = Ld(Cd1 + C1) =$$

$$Ld(Cd2 + C2) j\omega Cd1 + j\omega C1 + \frac{1}{j\omega L} = 0$$

Here, Ld is an inductance of the inductor 112.

The above equation represents that the susceptance at the mechanical resonance frequency is zero.

Thus, according to the fifth embodiment, when the ultrasonic transducer probe 126 is connected to the driving unit 110, a dumping capacitance Cd of the ultrasonic transducer can be reliably canceled. A lock point obtained by a PLL circuit in the driving circuit 14 coincides with the mechanical resonance point of the ultrasonic transducer 28, and efficient driving can always be performed regardless of the types of ultrasonic transducer 28.

Figure 16:
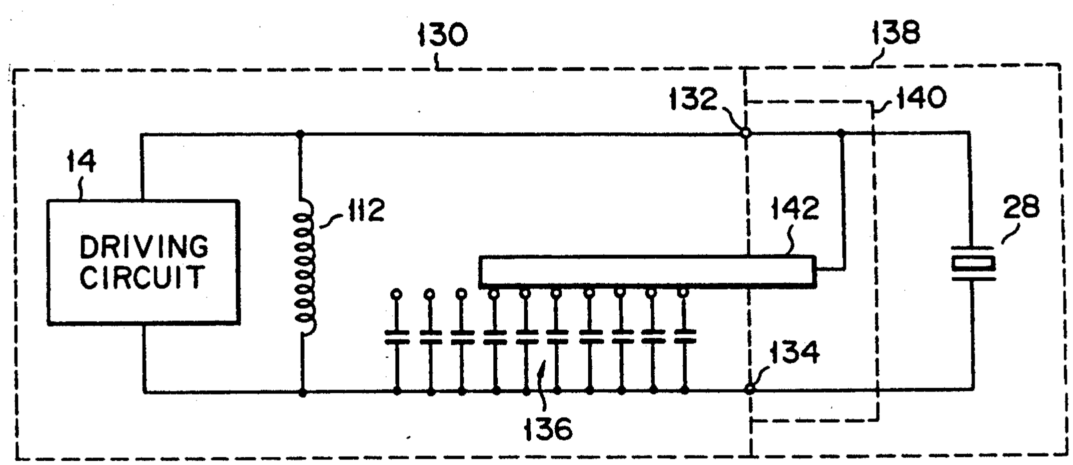
FIG. 16 is a block diagram of an ultrasonic transducer apparatus according to a sixth embodiment of the present invention.

FIG. 16 is a block diagram showing the sixth embodiment. In the fifth embodiment, a capacitor is selected by the wiring in the connector of the ultrasonic probe in the similar manner to those in the first and second embodiments. In contrast to this, in the sixth embodiment, a capacitor is mechanically selected by a member arranged in the connector in the similar manner to the third embodiment.

A driving unit 130 includes the driving circuit 14, an inductor 112, connection terminals 132 and 134, and ten capacitors 136 connected in parallel with the connection terminal 134. The inductor 112 is connected between the connection terminals 132 and 134. It is assumed that a capacitance of each capacitor 136 is constant.

Figure 17:
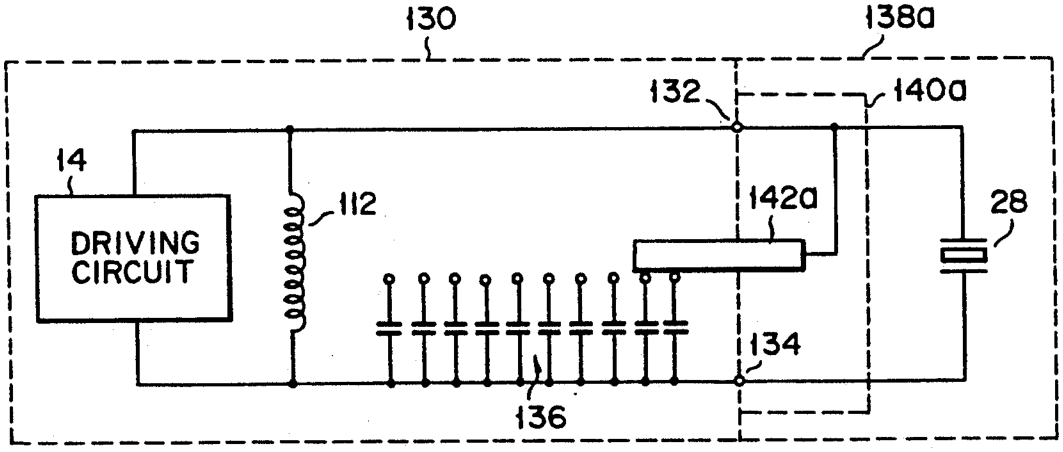
FIG. 17 is a block diagram of the sixth embodiment with another ultrasonic transducer probe.

An ultrasonic transducer probe 138 includes the ultrasonic transducer 28 and a connector 140 connected to the driving unit 130 through the connection terminals 132 and 134. The ultrasonic transducer 28 is connected between the connection terminals 132 and 134. The connector 140 holds a connector pin 142 to be connected to several capacitors of the ten capacitors 136 when the probe 138 is connected to the driving unit 130. One end of the connector pin 142 is connected to the connection terminal 132 in the probe 138. The length of the pin 142 is determined in accordance with a capacitive susceptance of the dumping capacitor in the ultrasonic transducer 28. In the arrangement shown in FIG. 16, the length of the pin 142 is relatively long, and the pin 142 is connected to a large number of capacitors 136. In contrast to this, in a probe 138*a* shown in FIG. 17, the length of the pin 142 is relatively short, and the pin 142 is connected to a small number of capacitors 136. Therefore, the number of capacitors 136 connected between the connection terminals 132 and 134 is changed in accordance with the type of the probe 138. As a result, a susceptance of the parallel circuit formed of the inductor 112 and the capacitors 136 which is connected between the connection terminals 132 and 134, i.e., is connected in parallel with the ultrasonic transducer 28 is changed, and a change in capacitive susceptance of the dumping capacitor of the ultrasonic transducer 28 for each probe can be compensated for.

Thus, according to the sixth embodiment, when the number of the capacitors connected to the pin 142 is varied, the susceptance in the driving unit is varied, and a change in dumping capacitance in the ultrasonic transducer can be compensated for. The capacitive susceptance can be canceled by the inductor 112 and the capacitors 136, and the ultrasonic transducer can be performed at the mechanical resonance point. In addition, according to the sixth embodiment, since wiring in the connector need not be changed, only two connection terminals are required to connect the driving unit to the probe, and a size of the connector can be decreased with a decrease in the number of connection terminals.

As described above, according to the fifth and sixth embodiments, there is provided an ultrasonic transducer apparatus having a constant inductance in the driving unit can equivalently vary an inductive susceptance of the driving unit by varying a total capacitance of the capacitors arranged in the driving unit in accordance with the capacitive susceptance. Therefore, even if the capacitive susceptance of the ultrasonic transducer is different from each other in accordance with the types of ultrasonic transducer probe, the ultrasonic transducer apparatus can cause the inductor to reliably cancel the capacitive susceptance, can drive the ultrasonic transducer at its mechanical resonance point, and can efficiently generate ultrasonic oscillations.

In the first to sixth embodiments, the inductance or the capacitance in the driving unit is varied to vary the inductive susceptance of the driving unit, and then the capacitive susceptance of the ultrasonic transducer is canceled. Further embodiments wherein an element for canceling a capacitive susceptance is arranged in the probe will be described hereinafter.

Figure 18:
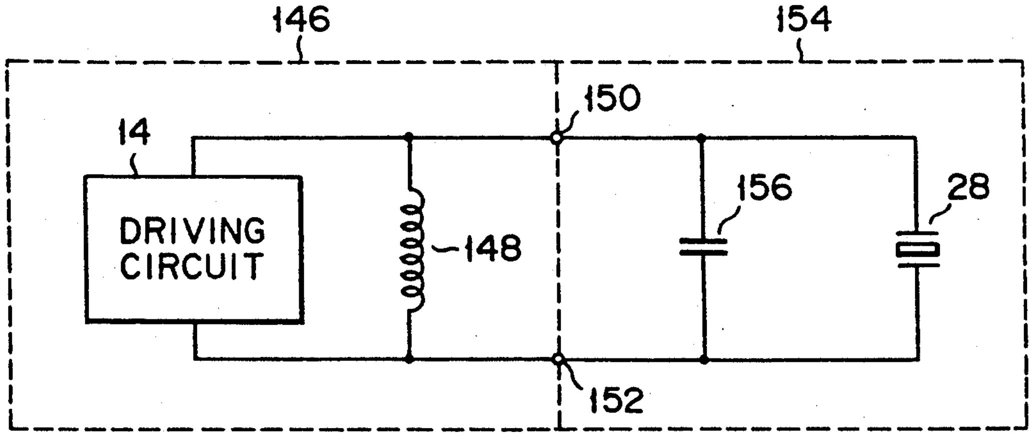
FIG. 18 is a block diagram of an ultrasonic transducer apparatus according to a seventh embodiment of the present invention.
Figure 19:
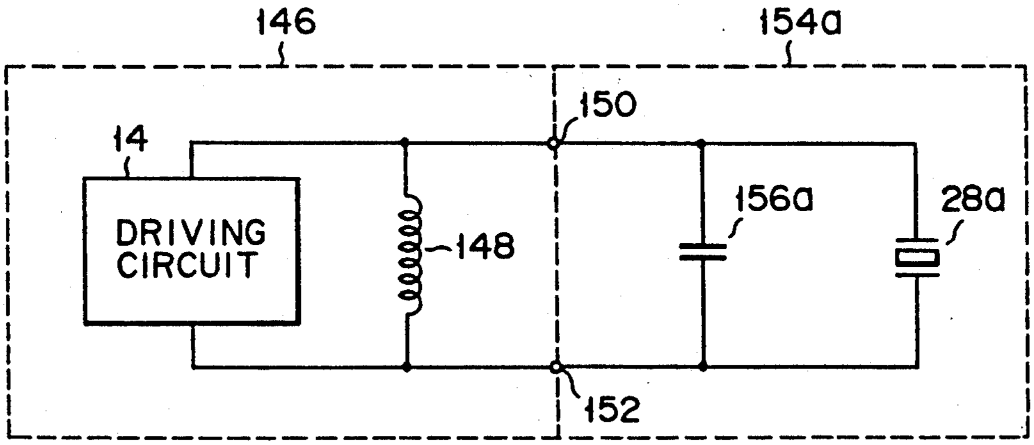
FIG. 19 is a block diagram of the seventh embodiment with another ultrasonic transducer probe.

FIG. 18 is a block diagram showing the seventh embodiment. A driving unit 146 includes the driving circuit 14, an inductor 148, and connection terminals 150 and 152. The inductor 148 is connected between the connection terminals 150 and 152. An ultrasonic transducer probe 154 connected to the driving unit 146 through the connection terminals 150 and 152 includes the ultrasonic transducer 28 and a capacitor 156. The capacitor 156 and the ultrasonic transducer 28 are connected to be parallel to each other between the connection terminals 150 and 152. Therefore, when the probe 154 is connected to the driving unit 146, the inductor 148 and the capacitor 156 are connected in parallel with the ultrasonic transducer 28. Although the inductor 148 has a constant inductance, a capacitance of the capacitor 156 in the probe 154 corresponds to the dumping capacitance in the ultrasonic transducer 28. Another probe 154*a* shown in FIG. 19 includes a capacitor 156*a* having a capacitance different from that of the capacitor 156.

The capacitances of the capacitors 156 and 156*a* will be described below. The above capacitances cause a composite capacitance of the dumping capacitance and these capacitances to be constant, and cause the capacitive susceptance of the probe to be equal to an inductive susceptance of the inductor 148. More specifically, the capacitors 156 and 156*a* function to compensate for the magnitudes of the capacitive susceptances of the dumping capacitors in accordance with the types of the ultrasonic transducers 28 and 28*a*, respectively. Therefore, when the probe 154 is connected to the driving unit 146, the capacitive susceptance of the dumping capacitor and the capacitor 156 of the ultrasonic transducer 28 can be reliably canceled by the inductive susceptance of the inductor 148 in the driving unit 146.

According to the seventh embodiment, the inductance in the driving unit is constant. However, a capacitor for compensating for a difference in dumping capacitance of the ultrasonic transducer is arranged in the probe. Therefore, the capacitive susceptance of the ultrasonic transducer can always be canceled by the inductance of the driving unit, and the ultrasonic transducer 28 can be reliably driven at its mechanical resonance point.

Figure 20:
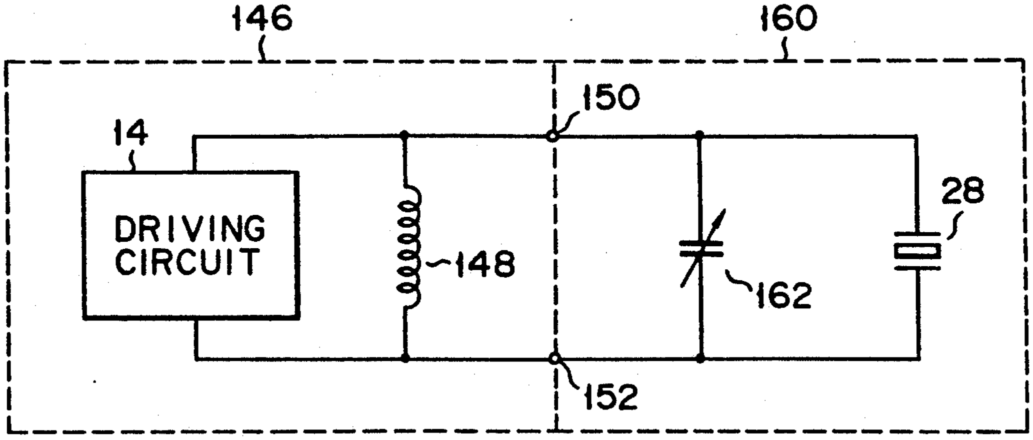
FIG. 20 is a block diagram of an ultrasonic transducer apparatus according to a eighth embodiment of the present invention.

FIG. 20 is a block diagram showing the eighth embodiment wherein the capacitors 156 and 156*a* in the seventh embodiment are constituted by a variable capacitor 162. In this embodiment, when the variable capacitor 162 is controlled in accordance with the type of ultrasonic transducer for each probe 160, a composite capacitance in each probe can be set constant.

According to the eighth embodiment, the probe 160 having a single arrangement can be realized by a variable capacitor without using various capacitors having different capacitances in accordance with the capacitive susceptance of a dumping capacitor of the ultrasonic transducer. Therefore, assembly and adjustment can be easily performed.

Figure 21:
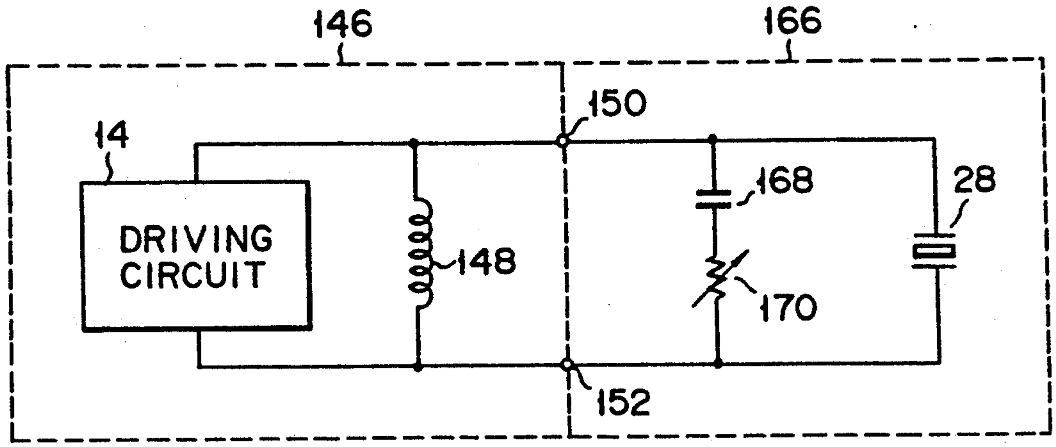
FIG. 21 is a block diagram of an ultrasonic transducer apparatus according to a ninth embodiment of the present invention.

FIG. 21 is a block diagram showing the ninth embodiment. A driving unit 146 has the same arrangement as those in the seventh and eighth embodiments. A probe 166 includes the ultrasonic transducer 28, a capacitor 168, and a variable resistor 170. The ultrasonic transducer 28 is connected between connection terminals 150 and 152. The capacitor 168 and the variable resistor 170 are connected in series with each other. This series circuit is connected in parallel with the ultrasonic transducer 28. Therefore, when the probe 154 is connected to the driving unit 146, an inductor 148, and the series circuit formed of the capacitor 168 and the variable resistor 170 are connected in parallel with the ultrasonic transducer 28.

Figure 22:
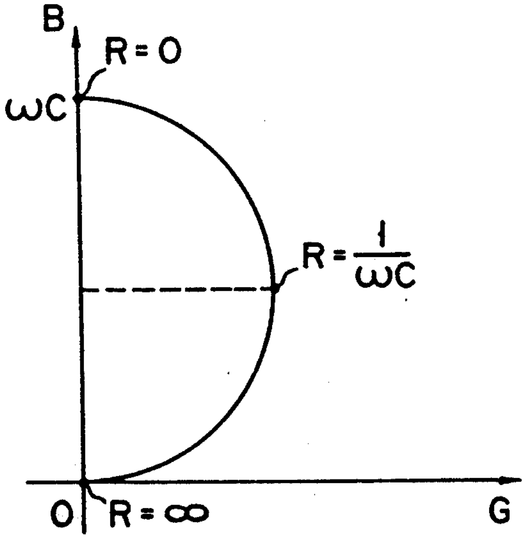
FIG. 22 is a graph of an admittance for explaining an operation of the apparatus in the ninth embodiment.

An admittance ($Y=G+jB$) of the series circuit of the capacitor 168 and the variable resistor 170 is changed, as shown in FIG. 22. Therefore, the variable resistor 170 is controlled to cause a composite capacitance of the probe 166 formed of the capacitor 168 and the dumping capacitor in the transducer 28 to be constant.

According to the ninth embodiment, the smaller probe can be achieved at lower cost as compared to a case wherein the variable capacitor is used as in the eighth embodiment. In addition, the probe which can achieve excellently stable measurement for a change in circumstances such as a temperature can be realized.

As described above, according to the seventh to ninth embodiments, an element for compensating for a difference in dumping capacitance is arranged in the probe. Therefore, a capacitive susceptance of the dumping capacitor can always be canceled even if the inductor in the driving unit has a constant inductance.

According to the present invention, there is provided an ultrasonic transducer apparatus which can cancel a capacitive susceptance even if the types and thus the dumping capacitors of ultrasonic transducer connected to the driving unit are different and can reliably drive the ultrasonic transducer at its mechanical resonance point, thus efficiently generating ultrasonic oscillations. Note that when the above apparatus is applied to a medical treatment apparatus for breaking a calculus or eliminating a tumor, an efficient medical treatment apparatus can be realized. The present invention is not limited to the above embodiments, and various changes and modifications can be made. For example, the impedance compensation element described in the first to sixth embodiments may be arranged in the probe. In contrast to this, the impedance compensation elements described in the seventh to ninth embodiments may be arranged in the driving unit. In addition, although a dumping capacitor is exemplified and has been described as a component for generating a capacitive susceptance of a ultrasonic transducer, another capacitive component such as a distributed capacitance may be used.

Additional advantages and modifications will readily occur to those skilled in the art. Therefore, the invention in its broader aspects is not limited to the specific details shown and described. Accordingly, departures may be made from such details without departing from the sprit or scope of the general inventive concept as defined by the appended claims and their equivalents.

What is claimed is:

1. An ultrasonic transducer apparatus comprising:

1) a probe including an ultrasonic transducer having:
   a series connection of an inductor, a resistor, and a capacitor; and
   a capacitive component for providing a capacitive susceptance connected in parallel with said series connection;
2) a driving unit separate from said probe and detachably connected to said probe, said driving unit including means for supplying to said ultrasonic transducer a driving signal having a frequency, said driving signal being such that a phase difference between a voltage applied to said ultrasonic transducer and a current supplied through said ultrasonic transducer is substantially zero; and
3) matching means including:
   first means arranged in said driving unit; and
   second means separate from said first means and arranged in said probe for causing varying of an impedance of said first means in accordance with the capacitive susceptance of the probe when said probe is connected to said driving unit;
   said first means of said matching means including a variable impedance component which is variable by means of said second means when said probe is connected to said driving unit so as to have an impedance value corresponding to the capacitive susceptance provided by said capacitive component of said probe;
   said impedance component of said first means comprising an inductive element;
   said first means further including a plurality of capacitors having different capacitances, each capacitor having one terminal connected to one terminal of said inductive element; and
   said second means comprising means for connecting another terminal of one of said capacitors to another terminal of said inductive element in accordance with said capacitive susceptance.

2. An apparatus according to claim 1, in which:
said second means comprises a capacitor having a capacitance in accordance with said capacitive susceptance, said capacitor being coupled in parallel to said ultrasonic transducer; and
said impedance component of said first means comprises an inductive element.

3. An apparatus according to claim 2, in which said capacitor is a variable capacitor.

4. An ultrasonic transducer apparatus comprising:

1) a probe including an ultrasonic transducer having:
   a series connection of an inductor, a resistor and a capacitor; and
   a capacitive component for providing a capacitive susceptance connected in parallel with said series connection;
2) a driving unit separate from said probe and detachably connected to said probe, said driving unit including means for supplying to said ultrasonic transducer a driving signal having a frequency, said driving signal being such that a phase difference between a voltage applied to said ultrasonic transducer and a current supplied through said ultrasonic transducer is substantially zero; and
3) matching means including:
   first means arranged in said driving unit; and
   second means separate from said first means and arranged in said probe for causing varying of an impedance of said first means in accordance with the capacitive susceptance of the probe when said probe is connected to said driving unit;

said first means of said matching means including a variable impedance component which is variable by means of said second means when said probe is connected to said driving unit so as to have an impedance value corresponding to the capacitive susceptance provided by said capacitive component of said probe;

said impedance component of said first means comprising an inductive element;

said first means further including a plurality of capacitors having the same capacitance, each capacitor having one terminal connected to one terminal of said inductive element; and said second means comprising means for connecting another terminal of each of a number of said capacitors, the number corresponding to said capacitive susceptance, to another terminal of said inductive element.

5. An apparatus according to claim 4, in which:

said second means comprises a capacitor having a capacitance in accordance with said capacitive susceptance, said capacitor being coupled in parallel to said ultrasonic transducer; and said impedance component of said first means comprises an inductive element.

6. An apparatus according to claim 5, in which said capacitor is a variable capacitor.

7. An ultrasonic transducer apparatus comprising:

1) a probe including an ultrasonic transducer having:

a series connection of an inductor, a resistor, and a capacitor; and a capacitive component for providing a capacitive susceptance connected in parallel with said series connection;

2) a driving unit separate from said probe and detachably connected to said probe, said driving unit including means for supplying to said ultrasonic transducer a driving signal having a frequency, said driving signal being such that a phase difference between a voltage applied to said ultrasonic transducer and a current supplied through said ultrasonic transducer is substantially zero; and 3) matching means including:

first means arranged in said driving unit; and second means separate from said first means and arranged in said probe for causing varying of an impedance of said first means in accordance with the capacitive susceptance of the probe when said probe is connected to said driving unit;

said first means of said matching means including a variable impedance component which is variable by means of said second means when said probe is connected to said driving unit so as to have an impedance value corresponding to the capacitive susceptance provided by said capacitive component of said probe;

said second means comprising a series circuit formed of a capacitor and a resistor having a resistance corresponding to said capacitive susceptance, said series circuit being coupled in parallel to said ultrasonic transducer; and said impedance component of said first means comprising an inductive element.

8. An apparatus according to claim 7, in which said resistor is a variable resistor.

9. An ultrasonic transducer apparatus comprising:

1) a probe including an ultrasonic transducer having:

a series connection of an inductor, a resistor, and a capacitor; and a capacitive component for providing a capacitive susceptance connected in parallel with said series connection;

2) a driving unit separate from said probe and detachably connected to said probe, said driving unit including means for supplying to said ultrasonic transducer a driving signal having a frequency, said driving signal being such that a phase difference between a voltage applied to said ultrasonic transducer and a current supplied through said ultrasonic transducer is substantially zero, said driving unit comprising:

a voltage-controlled oscillator for supplying an oscillation signal to said ultrasonic transducer;

means for detecting a voltage applied to said ultrasonic transducer, and for detecting a current supplied to said ultrasonic transducer;

means for detecting a phase difference between the detected voltage and the detected current; and means for controlling a voltage applied to said voltage-controlled oscillator in accordance with the detected phase difference; and 3) matching means including:

first means arranged in said driving unit; and second means separate from said first means and arranged in said probe for causing varying of an impedance of said first means in accordance with the capacitive susceptance of the probe when said probe is connected to said driving unit;

said first means of said matching means including a variable impedance component which is variable by means of said second means when said probe is connected to said driving unit so as to have an impedance value corresponding to the capacitive susceptance provided by said capacitive component of said probe.

10. An ultrasonic transducer apparatus comprising:

a probe including an ultrasonic transducer having:

a series connection of an inductor, a resistor, and a capacitor; and a capacitive element for providing a capacitive susceptance connected in parallel with said series connection;

a driving unit detachably connected to said probe and including means for supplying to said ultrasonic transducer a driving signal having a frequency, said driving signal being such that a phase difference between a voltage applied to said ultrasonic transducer and a current supplied through said ultrasonic transducer is substantially zero; and matching means arranged in said driving unit and including means for identifying the type of the probe when the probe is connected to the driving unit and a variable impedance element whose impedance value is variable as a function of the type of the probe, and wherein said impedance value of said variable impedance element is varied in accordance with the capacitive susceptance provided by said capacitive susceptance of said capacitive element of said probe, in response to said probe being connected to said driving unit.

11. An apparatus according to claim 10, in which said variable impedance element comprises an inductive element connected in parallel with said ultrasonic transducer.

12. An apparatus according to claim 10, in which said variable impedance element of said matching means comprises a variable capacitor arranged parallel to said ultrasonic transducer and having a capacitance in accordance with said capacitive susceptance.

13. An apparatus according to claim 10, in which said driving unit comprises:

a voltage-controlled oscillator for supplying an oscillation signal to said ultrasonic transducer;

means for detecting a voltage applied to said ultrasonic transducer, and for detecting a current supplied to said ultrasonic transducer;

means for detecting a phase difference between the detected voltage and the detected current; and means for controlling a voltage applied to said voltage-controlled oscillator in accordance with the detected phase difference.

14. An apparatus according to claim 11, in which:

said inductive element comprises a plurality of intermediate taps having different inductances; and said probe comprises means for selectively connecting one of said intermediate taps to said ultrasonic transducer in accordance with said capacitive susceptance when said probe is connected to said driving unit.

* * * * *